(12) United States Patent
Larisch et al.

(10) Patent No.: US 11,936,163 B2
(45) Date of Patent: Mar. 19, 2024

(54) RADIATION EMITTER

(71) Applicant: Changchun Institute of Optics, Fine Mechanics and Physics, Chinese Academy of Sciences, Changchun Jilin (CN)

(72) Inventors: Gunter Larisch, Neuenhagen (DE); Sicong Tian, Changchun Jilin (CN); Dieter Bimberg, Berlin (DE)

(73) Assignee: Changchun Institute of Optics, Fine Mechanics and Physics, Jilin (CN)

( * ) Notice: Subject to any disclaimer, the term of this patent is extended or adjusted under 35 U.S.C. 154(b) by 249 days.

(21) Appl. No.: 17/170,709

(22) Filed: Feb. 8, 2021

(65) Prior Publication Data

US 2022/0059990 A1 Feb. 24, 2022

(30) Foreign Application Priority Data

Aug. 24, 2020 (EP) ..................................... 20192355
Nov. 30, 2020 (EP) ..................................... 20210737

(51) Int. Cl.
*H01S 5/183* (2006.01)

(52) U.S. Cl.
CPC ...... *H01S 5/18311* (2013.01); *H01S 5/18352* (2013.01); *H01S 5/18394* (2013.01)

(58) Field of Classification Search
CPC ... H01S 5/18311; H01S 5/423; H01S 5/04257
See application file for complete search history.

(56) References Cited

U.S. PATENT DOCUMENTS 5,729,566 A 3/1998 Jewell
5,978,408 A 11/1999 Thornton
(Continued)

FOREIGN PATENT DOCUMENTS

CN 1335658 A 2/2002
CN 1845407 A 10/2006
(Continued)

OTHER PUBLICATIONS

Extended European Search Report dated Sep. 2, 2021 issued by the European Patent Office in related European Patent Application No. 21 16 8265.
(Continued)

*Primary Examiner* — Minsun O Harvey
*Assistant Examiner* — Stephen Sutton Kotter
(74) *Attorney, Agent, or Firm* — Gordon Rees Scully & Mansukhani, LLP

(57) ABSTRACT

A method of fabricating a radiation emitter including fabricating a layer stack that includes a first reflector, at least one intermediate layer, an active region and a second reflector; locally oxidizing the intermediate layer and thereby forming at least one unoxidized aperture; and locally removing the layer stack, and thereby forming a mesa that includes the first reflector, the unoxidized aperture, the active region, and the second reflector. Before or after locally removing the layer stack and forming the mesa: forming at least a first unoxidized aperture and at least a second unoxidized aperture inside the intermediate layer; etching a trench inside the layer stack, the trench defining a first portion and a second portion of the mesa, wherein the trench severs the intermediate layer(s) so that the first aperture is located in the first portion and the second aperture is located in the second portion of the mesa.

19 Claims, 9 Drawing Sheets

(56) References Cited

U.S. PATENT DOCUMENTS

| | | | |
|---|---|---|---|
| 7,388,893 B2* | 6/2008 | Watanabe | H01S 5/18311 |
| | | | 372/50.12 |
| 10,243,330 B2 | 3/2019 | Ledentsov et al. | |
| 2001/0019569 A1 | 9/2001 | Jayaraman et al. | |
| 2001/0043629 A1 | 11/2001 | Sun et al. | |
| 2002/0021733 A1 | 2/2002 | Lee et al. | |
| 2003/0179800 A1 | 9/2003 | Uebbing | |
| 2003/0185267 A1 | 10/2003 | Hwang et al. | |
| 2004/0258121 A1 | 12/2004 | Lee et al. | |
| 2005/0019973 A1* | 1/2005 | Chua | H01S 5/423 |
| | | | 438/42 |
| 2005/0151137 A1 | 7/2005 | Steinle | |
| 2006/0227836 A1 | 10/2006 | Omori et al. | |
| 2007/0058982 A1* | 3/2007 | Onishi | H01S 5/18355 |
| | | | 398/140 |
| 2011/0058587 A1 | 3/2011 | Sakurai et al. | |
| 2011/0182314 A1 | 7/2011 | Yoshikawa et al. | |
| 2011/0304684 A1 | 12/2011 | Numata et al. | |
| 2013/0272330 A1 | 10/2013 | Joseph et al. | |
| 2016/0352073 A1 | 12/2016 | Dummer et al. | |
| 2017/0373471 A1 | 12/2017 | Kropp et al. | |

FOREIGN PATENT DOCUMENTS

| | | |
|---|---|---|
| CN | 106887788 A | 6/2017 |
| CN | 110416874 A | 11/2019 |
| CN | 112 382 927 A | 2/2021 |
| EP | 1 501 162 A2 | 1/2005 |
| EP | 1 501 162 A3 | 12/2005 |

OTHER PUBLICATIONS

Extended European Search Report dated May 26, 2021 issued by the European Patent Office in related European Patent Application No. 20 21 0737.

European Search Report dated May 26, 2021 issued by the European Patent Office in related European Patent Application No. 20 21 0737.1.

Extended European Search Report dated Feb. 12, 2021 issued in related European Patent Application No. 20192355.4.

Chinese Office Action dated Jan. 7, 2022 issued by the Chinese Patent Office in related Chinese Application No. 202110432333.1.

G. Larisch et al.; "Optimization of VCSEL Photon Lifetime for Minimum Energy Consumption at Varying Bit Rates"; Optics Express 18931, Research Article; vol. 28; No. 13; Jun. 22, 2020; 7 pages.

G. Larisch, et al.; "910 nm Single-Mode VCSELs and Its Application for Few-Mode Transmission over Graded-Index Single-Mode Fibers"; ICTON 2020; TuB3.2; 22nd International Conference on Transparent Optical Networks; 4 pages.

V. Shchukin et al.; "Single-Mode Vertical Cavity Surface Emitting Laser via Oxide-Aperture-Engineering of Leakage of High-Order Transverse Modes"; IEEE Journal of Quantum Electronics; vol. 50; No. 12; Dec. 2014; pp. 990-995.

G. Larisch, et al.; "Energy-Efficient 50+ Gbit/s VCSELs for 200+ Gbit/s Optical Interconnects"; IEEE Journal of Selected Topics in Quantum Electronics; (2019); 6 pages.

First Office dated Apr. 13, 2022 issued in related Chinese Patent Application No. 202110848970.7.

Second Office dated Apr. 24, 2022 issued in related Chinese Patent Application No. 202110432333.1.

* cited by examiner

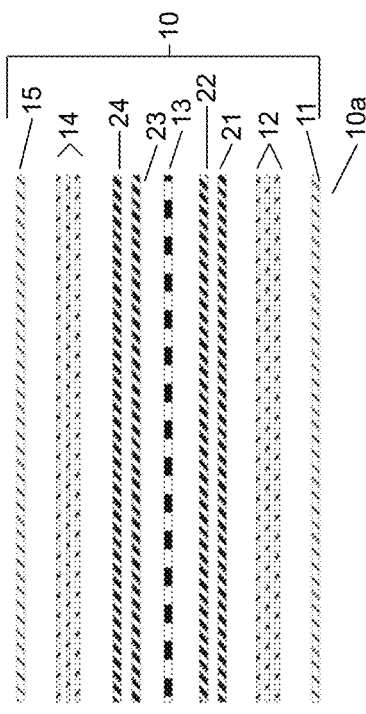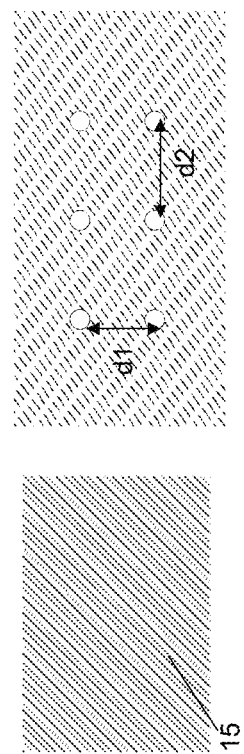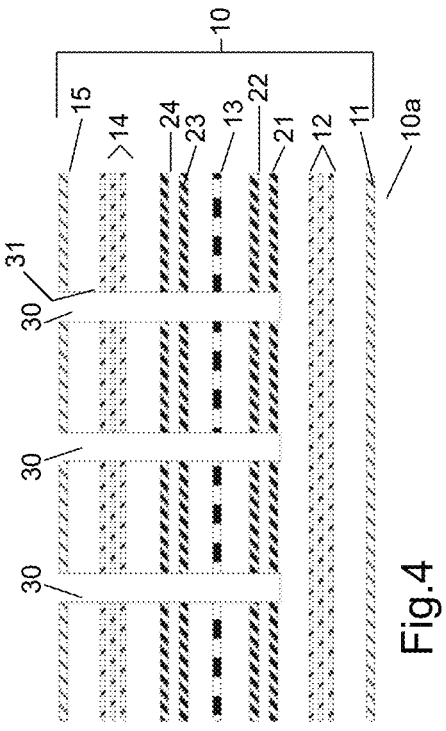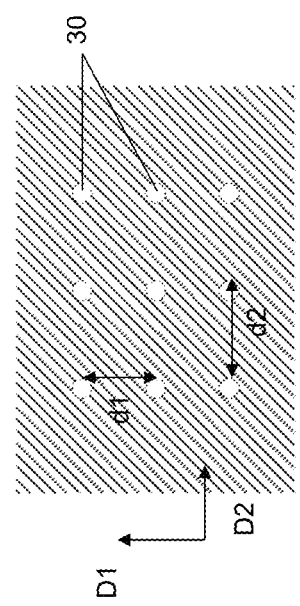

RADIATION EMITTER

CROSS REFERENCE TO RELATED APPLICATIONS

The present application claims the benefit of and priority to European Patent Application EP20192355 filed on Aug. 24, 2020, and European Patent Application EP20210737 filed on Nov. 30, 2020. The foregoing applications are incorporated by reference herein in their entirety.

BACKGROUND OF THE INVENTION

Vertical Cavity Surface Emitting Lasers (VCSELs) are key devices for a rapidly increasing spectrum of systems. It is known, that VCSELs are the dominating light sources for short and medium reach interconnects in workstation clusters or supercomputers due to their large bitrate in concert with a small energy consumption per bit. Both parameters—increase of bitrate and energy consumption (defined by energy to data ratio EDR)—are presently the subjects of large progress. There exists a trade-off between these parameters. The optimal properties of a VCSEL for a given system depends on its bitrate [Larisch et al. Optics Express 28, 6, 2020).

The workload of a workstation cluster or a supercomputer is volatile. Processors are rapidly adapting their performance and energy consumption depending on actual demand. State-of-the-art processors have different cores for different workloads. The operating parameters of a present VCSEL, being the light source of an active optical cable connecting work stations to each other however, cannot be adapted to the varying workload of e.g. a network, a work station cluster, . . . and is thus operating typically under non-optimum conditions, like larger energy, cooling water, consumption than necessary.

Methods according to the preamble of claim 1 are known in the art in connection with the fabrication of VCSELs.

OBJECTIVE OF THE PRESENT INVENTION

In view of the above, an objective of the present invention is, to propose a multiple radiation emitter that provides novel functionality like being rapidly switchable to optimized conditions with regard to variations of demand.

A further objective of the present invention is to provide a method for fabricating such multiple radiation emitters.

BRIEF SUMMARY OF THE INVENTION

An exemplary embodiment of the present invention relates to a method of fabricating a radiation emitter comprising the steps of: fabricating a layer stack that comprises a first reflector, at least one intermediate layer, an active region, and a second reflector; locally oxidizing the at least one intermediate layer and thereby forming at least one unoxidized aperture in the at least one intermediate layer; and locally removing the layer stack, and thereby forming a mesa, wherein the mesa comprises the first reflector, the at least one unoxidized aperture, the active region, and the second reflector. Before or after locally removing the layer stack and forming the mesa the following steps are carried out: forming at least a first unoxidized aperture and at least a second unoxidized aperture inside the intermediate layer; etching a trench inside the layer stack, said trench defining at least a first portion of the mesa and at least a second portion of the mesa, wherein the trench severs the intermediate layer and separates the apertures such that the first aperture is located in the first portion of the mesa and the second aperture is located in the second portion of the mesa; and fabricating an individual electrical contact for each of the portions.

An advantage of this embodiment of the invention is, that the fabricated emitter provides mesa portions that can be addressed individually. The separate mesa portions therefore allow operating the emitter in different light emission modes. For instance, only one or a group of mesa portions may be subjected to an electrical current for active operation whereas one or more other mesa portions may remain inactive. For instance, if the energy efficiency (EDR) for a given bit rate of the mesa portions differ, mesa portions can be selected in view of the bit rate of an external electrical data signal that needs to be optically transmitted (e.g. according to the teaching by Larisch et al. [Optics Express 28, 6, 2020]).

Another advantage of this embodiment of the invention is that mesa portions of the fabricated emitter may have different optical properties for instance regarding the polarization of the output radiation. In this case, polarization multiplexing can be achieved by simultaneously applying different electrical data signals to the mesa portions, still allowing to simply butt couple or focus the optical output into a fiber without any beam combining optics.

The size, i.e. diameter of the mesa, is preferably in the range between 10 and 100 µm. In this case, the size of the mesa is adapted to the typical diameter (50 µm or 62.5 µm) of the core of a standard multimode fiber and butt-coupling between a standard multimode fiber and the mesa is possible.

The steps of forming the at least two apertures inside the intermediate layers preferably comprises: vertically etching at least six blind holes inside the layer stack, wherein the blind holes vertically extend at least to the lowest intermediate layer and expose the intermediate layers; and oxidizing sections of the intermediate layers via the blind holes and thereby forming said apertures inside the intermediate layers.

Said oxidizing of the intermediate layers is preferably carried out via the sidewalls of the blind holes in lateral direction, wherein from each hole an oxidation front radially moves outwards and wherein the etching is terminated before the entire intermediate layer is oxidized, thereby forming said apertures that are each limited by at least three oxidation fronts.

At least one of the apertures preferably has a rhombus-like shape where each side is formed by a circular or elliptical arc. Rhombus-like shapes may be obtained when four oxidation fronts delimit the aperture.

Additionally, or alternatively at least one of the apertures may have a triangle-like shape where each side is formed by a circular or elliptical arc. Triangle-like shapes may be obtained when three oxidation fronts delimit the aperture.

According to a preferred embodiment, the first aperture is elongated along a first direction, the second aperture is elongated along a second direction, and the first and second direction are angled relative to each other. Angled orientations provide the option of transmitting data signals in a polarization-multiplexing mode.

The longitudinal axis of the first aperture may be oriented perpendicular to the longitudinal axis of the second aperture. A perpendicular orientation allows generating two polarizations at the same time.

Alternatively, the longitudinal axis of the first aperture may have a 60°-angle with respect to the longitudinal axis of the second aperture. A 60°-orientation allows generating three polarizations at the same time.

According to another preferred embodiment in each portion of the mesa preferably at least two apertures are fabricated which have the same orientation. Two or more apertures per mesa portion increase the resulting output power.

According to yet another preferred embodiment, the apertures in the first portion of the mesa may be oriented along the same first direction, and the apertures in the second portion of the mesa are preferably oriented along the same second direction which differs from the first direction. Said trench may also define a third portion of the mesa in addition to said first and second portion. The apertures in the first portion are preferably oriented along the same first direction. The apertures in the second portion are preferably oriented along the same second direction. The apertures in the third portion are preferably oriented along the same third direction. The first, second and third directions preferably differ.

The first portion of the mesa preferably may be provided with a first optical damping tuning layer that is fabricated on top of the layer stack. The second portion of the mesa may be provided with a second optical damping tuning layer that is fabricated on top of the layer stack. The optical characteristics of the first optical damping tuning layer may differ from the optical characteristics of the second optical damping tuning layer, for instance in order to allow switching between optimum EDRs for a given system bit rate in view of the teaching in the above mentioned publication by Larisch et al. [Optics Express 28, 6, 2020].

The layer stack preferably comprises two or more intermediate (oxidizable) layers. At least one of the intermediate layers is preferably formed inside the first reflector or between the first reflector and the active region and at least one of the intermediate layers is preferably formed inside the second reflector or between the second reflector and the active region. One intermediate layer above and one below the active region allows fabricating apertures above and below the active region to provide high current density and high optical output power.

Another exemplary embodiment of the present invention relates to a radiation emitter comprising: a layer stack having a first reflector, at least one aperture formed by unoxidized material of an intermediate layer that is partly oxidized and partly unoxidized, an active region, and a second reflector, wherein a mesa of the emitter includes at least the first reflector, the unoxidized aperture, the active region, and the second reflector. The mesa comprises at least two mesa portions which are separated by a trench. Each mesa portion comprises at least one aperture inside the intermediate layer. Each mesa portion is electrically contacted by an individually assigned electrical contact.

The mesa preferably forms a vertical emitting laser (VCSEL).

The mesa preferably has steps.

The emitter preferably comprises a fiber. The mesa including all of the apertures of the mesa is preferably optically coupled (e.g. butt-coupled) to said same fiber.

The cross section and/or diameter of the mesa ring, comprising all apertures, is preferably in the range between 10 and 100 µm in order to be adapted to the diameter of the core of a standard multimode fiber.

BRIEF DESCRIPTION OF THE DRAWINGS

In order that the manner, in which the above-recited and other advantages of the invention are obtained, will be readily understood, a more particular description of the invention briefly described above will be rendered by reference to specific embodiments thereof, which are illustrated in the appended figures. Understanding that these figures depict only typical embodiments of the invention and are therefore not to be considered limiting of its scope, the invention will be described and explained with additional specificity and detail by the use of the accompanying drawings in which FIGS. 1-16 illustrate method steps for fabricating an exemplary embodiment of a radiation emitter, in the form of a VCSEL, according to the present invention.

DETAILED DESCRIPTION OF THE PREFERRED EMBODIMENTS

The preferred embodiments of the present invention will be best understood by reference to the drawings, wherein identical or comparable parts are designated by the same reference signs throughout.

It will be readily understood that the parameters of the embodiments of the present invention, as generally described herein, could vary in a wide range. Thus, the following more detailed description of exemplary embodiments of the present invention, is not intended to limit the scope of the invention but is merely representative of presently preferred embodiments of the invention.

Figure 16:
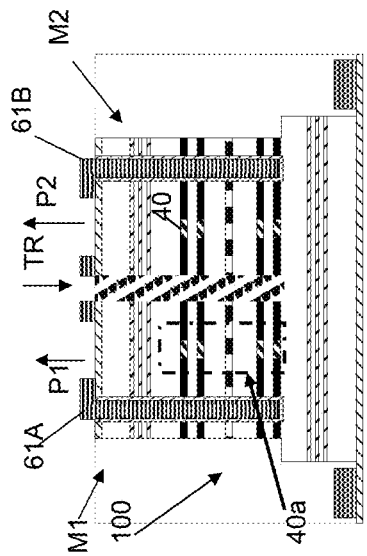

FIGS. 1-16 show method steps for fabricating an exemplary embodiment of a multiple radiation emitter in the form of a VCSEL 100 (see FIG. 16). The VCSEL 100 of FIG. 16 comprises two mesa portions M1 and M2 that can be individually controlled via individual top contacts 61A and 61B.

Each of the mesa portions M1 and M2 comprises one or a plurality of VCSEL subunits that are each defined by a stack 40*a* of vertically aligned apertures 40. Each stack 40*a* of vertically aligned apertures 40 can generate radiation on its own, however the radiation generated by the stacks 40*a* is preferably different in each mesa portion M1 and M2 such that each mesa portion M1 and M2 generates a set of own EDR upon transfer of different data rates and/or can show individual optical characteristics, for instance in terms of polarization and field distribution.

Since each of the mesa portions M1 and M2 can be individually controlled, the radiation P1 generated by the stacks 40*a* of vertically aligned apertures 40 in the mesa portion M1 may differ from the radiation P2 generated by the stacks 40*a* of vertically aligned apertures 40 in the mesa portion M2.

FIGS. 1 and 2 show a top view and a cross-section of an exemplary layer stack 10. The layer stack comprises a first (bottom) contact layer 11, a first reflector 12, two intermediate layers 21 and 22, hereinafter referred two as first lower intermediate layer 21 and second lower intermediate layer 22, an active region 13, two intermediate layers 23 and 24, hereinafter referred to as first upper intermediate layer 23 and second upper intermediate layer 24, a second reflector 14, and a second (top) contact layer 15. The four intermediate layers 21-24 consist of oxidizable material which is still unoxidized in FIGS. 1 and 2.

The first contact layer 11 is preferably highly p-doped (doping level>$10^{19}$ cm$^{-3}$). The second contact layer 15 is preferably highly n-doped (doping level>$10^{19}$ cm$^{-3}$).

The first and second reflectors 12 and 14 may be distributed Bragg reflectors (DBRs) that each comprise a plurality of reflector layers with alternating reflective indices.

The layer stack 10 is preferably fabricated by depositing semiconductor material layers such as AlGaAs, of varying composition, on a substrate 10a.

In the exemplary embodiment of FIG. 2, two intermediate layers 21-22 are located below the active region 13 and two intermediate layers 23-24 are located above the active region 13. Alternatively, the layer stack 10 may comprise less or more intermediate layers that are oxidizable. In a minimal configuration, a single intermediate layer is sufficient. However, to provide a high current density in the active region 13, at least one intermediate layer above and at least one intermediate layer below the active region 15 is advantageous.

FIGS. 3a and b and 4 show a top view and a cross-section of the layer stack 10 of FIGS. 1 and 2 after vertically etching 6, respectively 9 blind holes 30 inside the layer stack 10. The blind holes 30 vertically protrude to the oxidizable intermediate layers 21-24 and expose the intermediate layers 21-24.

In the exemplary embodiment of FIG. 3, the blind holes 30 are arranged in a lattice-like way forming a grid having a first grid spacing d1 in a first direction D1 and a second grid spacing d2 in a second different direction D2.

In one preferred embodiment, the first grid spacing d1 and the second grid spacing d2 are identical. In another preferred embodiment, the first grid spacing d1 is between 10% and 30% larger than the second grid spacing d2. Furthermore, the first and second direction D1, D2 can be perpendicular. Alternatively, the first and second direction D1, D2 can be angled, preferably with an angle between 60° and 85°. The grid spacing and/or directions may be optimized to achieve a desired shape (e.g. elongated) shape of the resulting apertures 40 (see FIG. 5).

Further, the holes 30 may be arranged such that the resulting apertures 40 are elongated in predefined directions, with the same orientation for each aperture or varying orientations. Such arrangements of blind holes 30 will be explained further below in connection with FIGS. 22-25.

Figure 6:
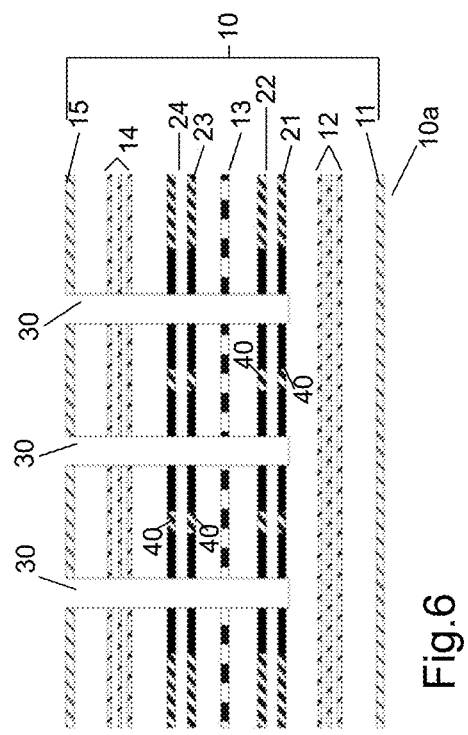
Figure 5:
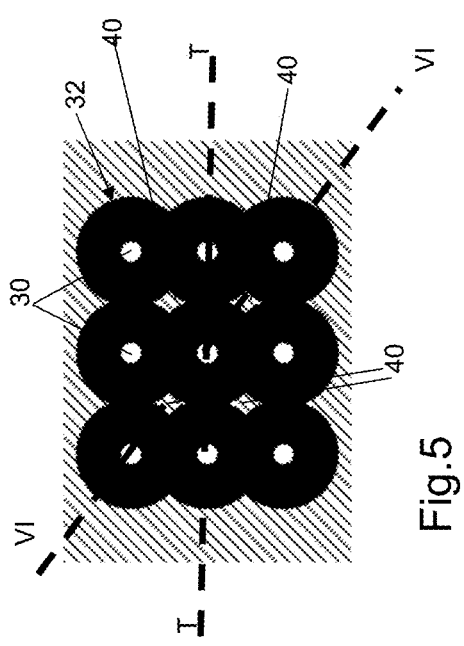

FIGS. 5 and 6 show the layer stack 10 of FIGS. 3b and 4 after oxidizing the oxidizable intermediate layers 21-24 via the sidewalls 31 of the blind holes 30 in lateral direction. From each blind hole 30, an oxidation front radially (in lateral direction) moves outwards during the oxidation. The step of etching is terminated before the entire intermediate layers 21-24 are oxidized to form unoxidized apertures 40. Each unoxidized aperture 40 is preferably limited by at least three oxidation fronts of oxidized layer material 20. In the exemplary embodiment of FIG. 5, each unoxidized aperture 40 is limited by four oxidation fronts 32 of oxidized layer material 20 and therefore has a diamond-like shape.

The unoxidized apertures 40 are vertically aligned and form aperture stacks 40a (see FIG. 16) of vertically aligned apertures. Since the layer stack 10 comprises four intermediate layers 21-24, each aperture stack comprises four vertically aligned apertures 40. Each aperture stack 40a of vertically aligned apertures 40 forms a VCSEL subunit inside the VSEL 100 of FIG. 16.

The oxidized layer material 20 is preferably electrically isolating.

In FIG. 5, line VI-VI designates the cross-section shown in FIG. 6. Line T-T designates the position of a trench TR (see FIGS. 15 and 16) that will be fabricated at a later stage.

Figure 8:
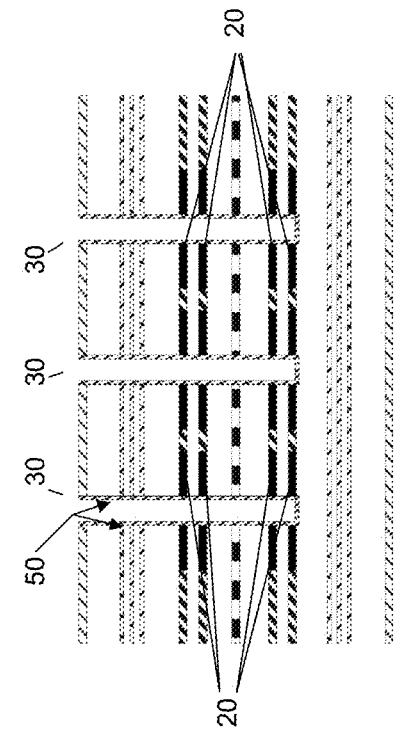
Figure 7:
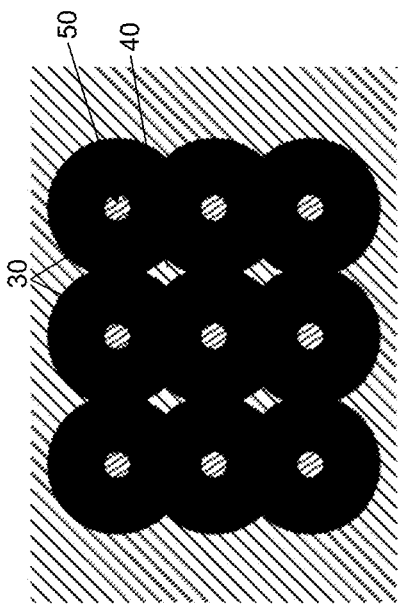

FIGS. 7 and 8 show the layer stack 10 of FIG. 6 after depositing an intermediate isolating layer 50 on the sidewalls of the blind holes 30. The sidewalls of all the blind holes 30 may be covered as shown in FIGS. 7 and 8. Alternatively, those blind holes that are located on line T-T in FIG. 5 may be excluded from deposition because they are located in the vicinity of the future trench TR mentioned above.

Figure 10:
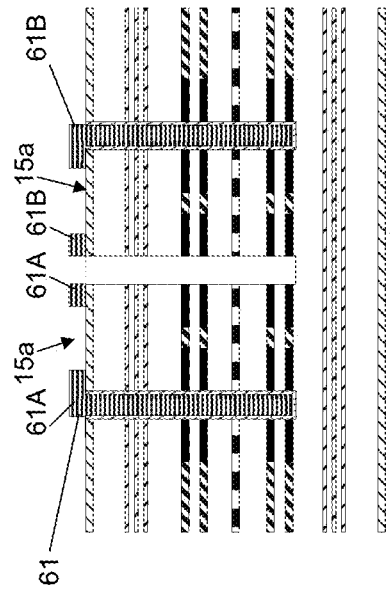
Figure 9:
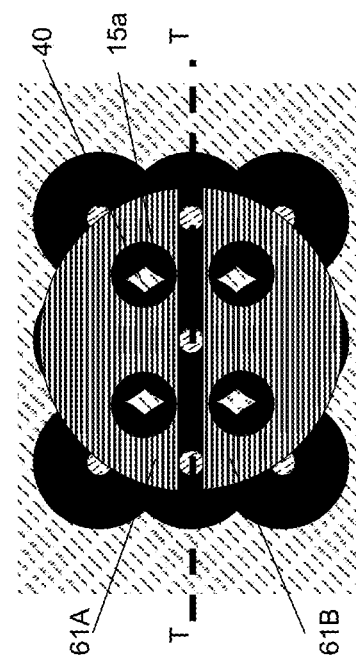

FIGS. 9 and 10 show the layer stack 10 of FIG. 8 after depositing a first conducting material 61 on the top contact layer 15. The first conducting material 61 covers sections of the top contact layer 15 and forms two separated top contacts 61A and 61B. The top contacts 61A and 61B are separated along the line T-T in FIGS. 5 and 9.

Sections 15a of the top contact layer 15 above the apertures 40 are preferably left uncovered to allow the optical radiation P1 and P2 (see FIG. 16) to exit the radiation emitter 100 without additional attenuation. In other words, the two separate top contacts 61A and 61B preferably provide openings for outgoing radiation. The openings are preferably each aligned with the allocated apertures 40 located below. In other words, the apertures below each opening are preferably aligned with respect to the opening as well as to one another in order to form a stack 40a of aligned apertures 40 that is aligned to the allocated opening (see FIG. 16).

Figure 12:
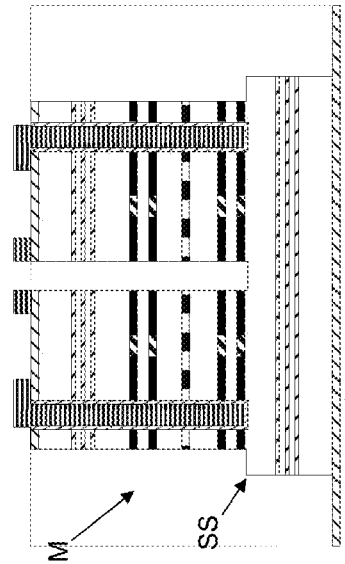
Figure 11:
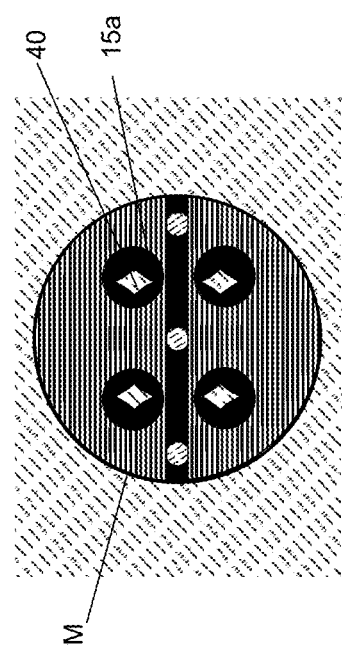

In addition to its electrical influence, the first conducting material 61 preferably also forms a heat sink that dissipates heat from the inside of the blind holes during the operation of the resulting radiation emitter 100. To this end, the first conducting material 61 preferably also fills the blind holes 30 that are not located in the vicinity of line T-T in FIGS. 5 and 9. The first conducting material 61 is therefore preferably not just electrically but also thermally well conductive. The conducting material 61 is preferably Gold, Platinum, Titanium, Nickel, Gold-Germanium alloy or a sequence of these materials, depending on the doping type of the semiconductor material that is to be contacted. FIGS. 11 and 12 show the layer stack 10 of FIGS. 9 and 10 after etching a mesa M inside the layer stack 10. The mesa M may have one or more steps SS. The mesa M preferably extends to the bottom contact layer 11 to allow depositing a second conductive material 62, see FIG. 14, and thereby contacting the bottom contact layer 11.

Figure 14:
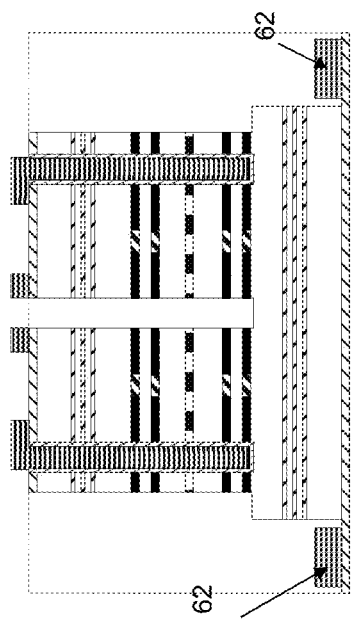
Figure 13:
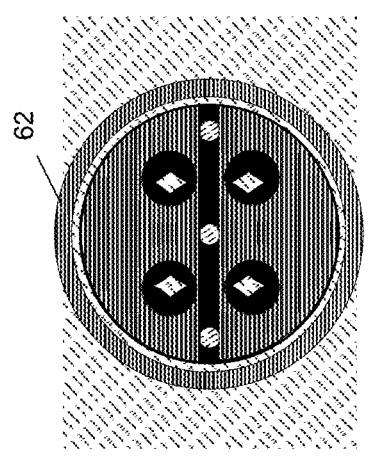

FIGS. 13 and 14 show the layer stack 10 of FIGS. 11 and 12 after depositing the second conductive material 62 and contacting the bottom contact layer 11.

Figure 15:
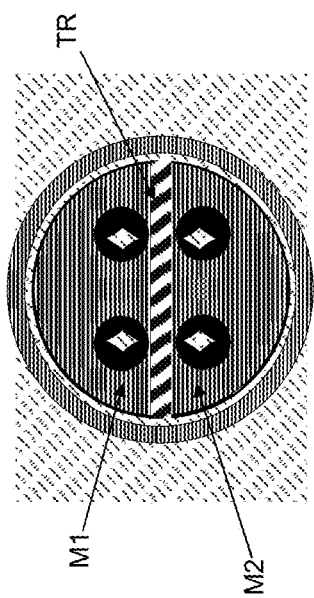

FIGS. 15 and 16 show the layer stack 10 of FIGS. 13 and 14 after etching above mentioned trench TR inside the layer stack 10 along the line T-T. The trench TR defines a first portion M1 of the mesa M and a second portion M2 of the mesa M. The trench TR severs all the intermediate layers 21-24 such that the apertures 40 are either located below the openings of the first contact 61A or the openings of the second contact 61B.

The trench may be filled with an electrically isolating material having preferably large thermal conductivity and a low dielectric constant (refractive index<2.2).

The layer stack 10 of FIGS. 15 and 16 provide a radiation emitter that comprises two laser sections that are each defined by the respective mesa portion M1 or M1. The mesa portions M1 and M2 can be individually controlled.

When applying an electrical voltage between the first and second conducting material 61 and 62 via top contacts 61A and/or 61B, electrical current will flow through the apertures 40 of all oxidizable layers 21-24 in the respective mesa portion M1 and/or M2. The active region 13 generates optical radiation that exits the radiation emitter 100 through the surface sections 15a of the top conducting layer 15 that are uncovered by the first conductive material 61.

In each of the mesa portions M1 and M2, each of the apertures 40 in combination with the adjacent section of the active region 13 may be regarded as an individual VCSEL unit. Therefore, the radiation emitter 100 comprises a plurality of these individual VCSEL units. The individual VCSEL units are narrowly spaced such that their radiation can be coupled into the same optical fiber (e.g. multimode fiber MMF as shown in FIG. 17).

Figure 17:
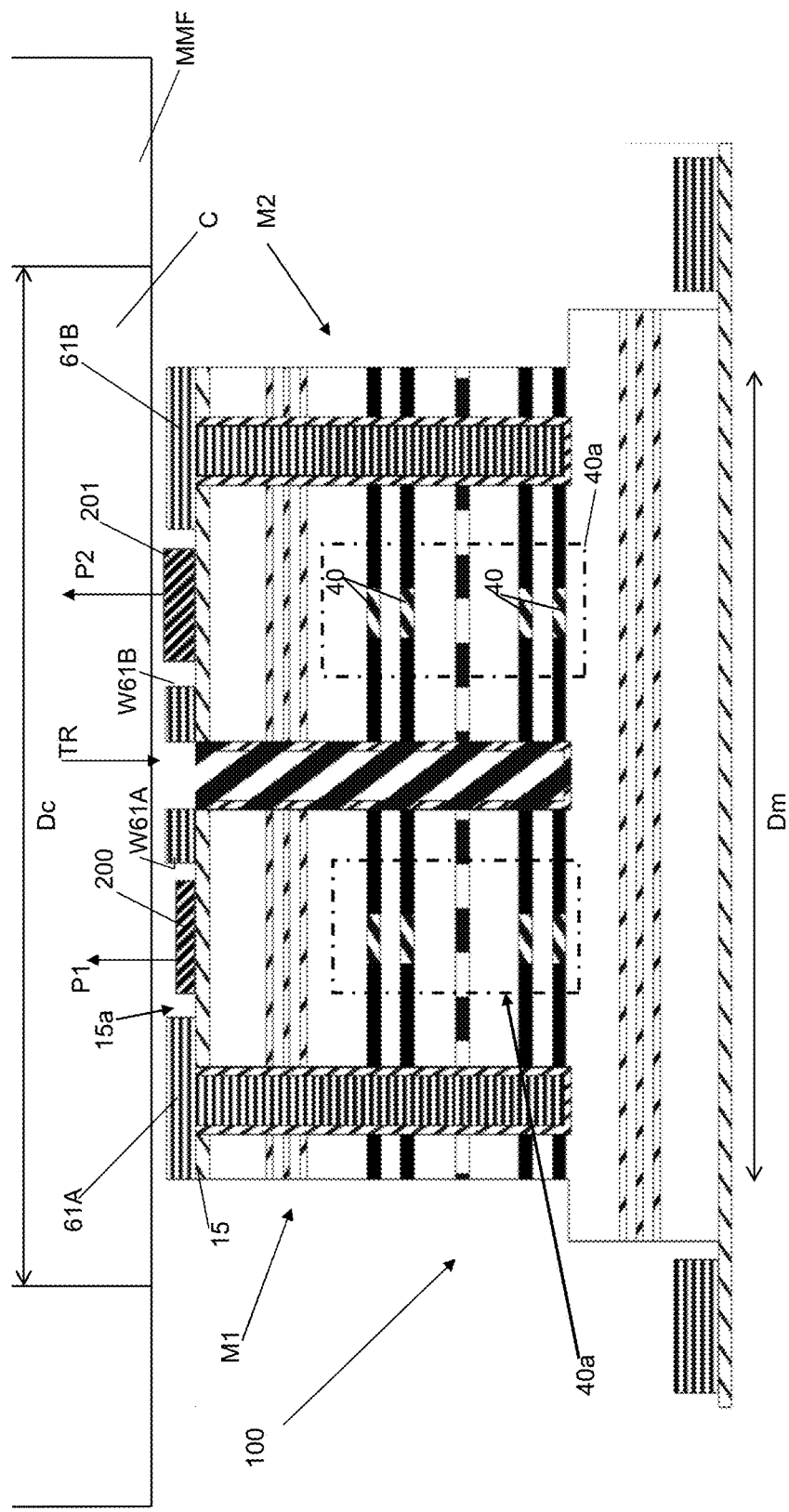
FIGS. 17-18 illustrate a second exemplary embodiment of a radiation emitter according to the present invention, FIGS. 19—illustrate EDR (energy to data ratio) values versus bit-rate for different damping layers.

FIG. 17 depicts a second exemplary embodiment of a radiation emitter 100 according to the present invention. In contrast to the first embodiment according to FIG. 16, the second embodiment comprises a first and a second damping tuning layer 200 and 201. The damping tuning layers 200 and 201 are deposited on top of the layer stack 10, preferably after fabricating the top contacts 61A and 61B.

The first optical damping tuning layer 200 is located on the first portion M1 of the mesa M. In the embodiment of FIG. 17, the first optical damping tuning layer 200 is arranged only on top of the uncovered sections 15a of the first top contact layer 15, i.e. inside the openings or windows W61A of the first top contact 61A. Alternatively, the first optical damping tuning layer 200 may also completely or partly cover the top contact 61A.

The second optical damping tuning layer 201 is located on the second portion M2 of the mesa M. In the embodiment of FIG. 17, the second optical damping tuning layer 201 is arranged on top of the uncovered sections 15a of the top contact layer 15, i.e. inside the openings or windows W62A of the second top contact 61B. Alternatively, the second optical damping tuning layer 201 may also completely or partly cover the top second contact 61B.

The optical characteristics of the first optical damping tuning layer 200 differs from the optical characteristics of the second optical damping tuning layer 201. For instance, the thicknesses of the layers may differ as shown in FIG. 17. Additional or alternatively, the materials of the layers may differ.

Figure 18:
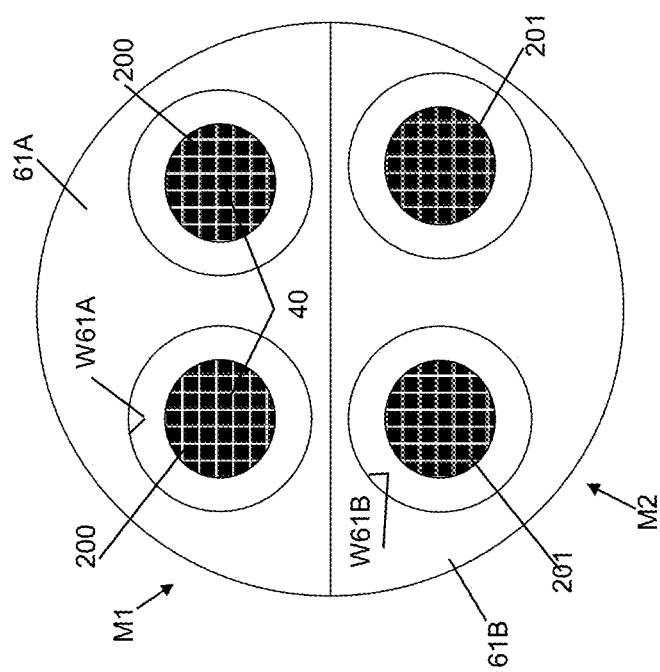

FIG. 18 depicts a top view of the second embodiment of FIG. 17 showing two emitters for each portion of the mesa.

In this second embodiment of FIGS. 17 and 18, the optical damping tuning layers 200 and 201 may be optimized for maximum energy efficiency at a given bitrate. For instance, the first mesa portion M1 may be optimized to achieve largest energy-efficient bitrate via low damping. In contrast, the second mesa portion M2 may be optimized to dissipate a minimum energy per bit at a medium bitrate. Depending on external requirements, either the first mesa portion M1 or the second mesa portion M2 may be operated to generate optical radiation.

In the embodiments shown in FIGS. 16 and 17, the cross section and diameter Dm of the mesa M is preferably in the range between 10 and 100 µm in order to be adapted to the diameter Dc of the core C of a standard multimode fiber MMF (typical core diameter Dc usually 50 or 65 µm). Such a dimension Dm of the mesa M allows both mesa portions M1 and M2 to efficiently couple their emissions into the same multimode fiber MMF. The multimode fiber MMF is preferably butt-coupled to the mesa M and its mesa portions M1 and M2 as shown on FIG. 17.

Figure 19:
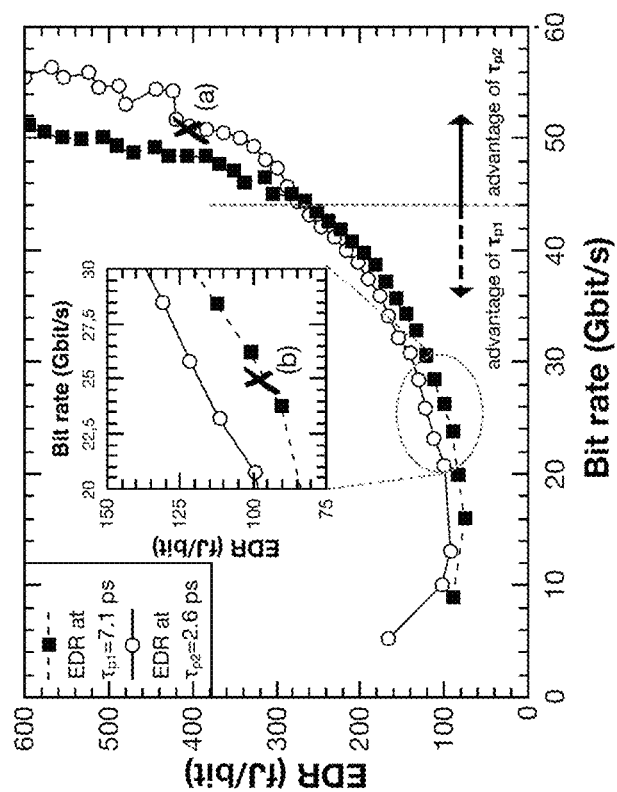

FIG. 19 shows EDR versus bitrate calculated from the small-signal response of mesa portions with different damping properties. Each mesa portion can be optimized for one target bit rate.

As s result, a two-portion mesa emitter can be optimized for two target bit-rate areas, as shown in FIG. 19. The two-portion mesa emitter can be switched to the optimum EDR for a given target bit-rate area because switching changes the properties of the emitter.

In the first and second exemplary embodiments according to FIGS. 16 and 17, each mesa portion M1 and M2 comprises two apertures 40. Alternatively, the mesa portions may comprise more or less apertures 40.

In the first and second exemplary embodiments according to FIGS. 16 and 17/18, the size, contour and orientation of all apertures 40 are identical. Alternatively, the size, contour and orientation of the apertures 40 may vary as will be discussed further below in connection with FIGS. 20 to 24.

Figure 20:
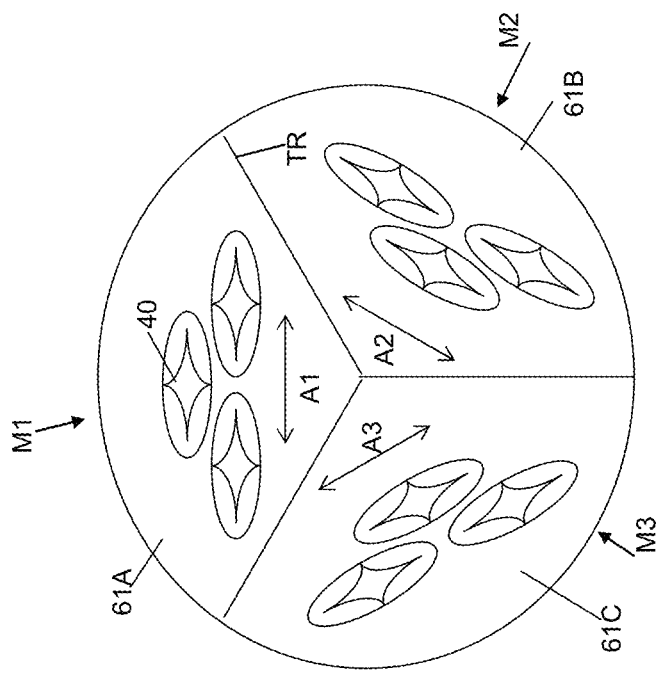

FIG. 20 depicts a schematic top view of a third exemplary embodiment of a radiation emitter according to the present invention. In contrast to the embodiments according to FIGS. 16 and 17, the mesa in FIG. 20 comprises three mesa portions M1, M2 and M3 which are each provided with a separate top contact 61A, 61B and 61C. Via the allocated top contacts 61A, 61B and 61C, the three mesa portions M1, M2 and M3 may be operated individually, i.e. in parallel or consecutively, e.g. in individually assigned time frames.

In the exemplary embodiment of FIG. 20, the apertures 40 in each mesa portion M1, M2 and M3 are elongated along the same "portion-assigned" longitudinal direction A1, A2 or A3. More specifically, each mesa portion has its individually assigned orientation. The orientation of the apertures 40 in the first portion M1 and their longitudinal direction A1 has an angle of 60° with respect to the orientation of the apertures 40 in the second portion M2 and their longitudinal direction A2. The orientation of the apertures 40 in the second portion M2 and their longitudinal direction A2 has an angle of 60° with respect to the orientation of the apertures 40 in the third portion M3 and their longitudinal direction A3. Therefore, the orientation of the apertures 40 in the third portion M3 and their longitudinal direction A3 also has an angle of 60° with respect to the orientation of the apertures 40 in the first portion M1 and their longitudinal direction A1.

In other words, the longitudinal directions A1, A2 and A3 have an angle of 60° with respect to one another.

The elongated shape of the apertures 40 may lead to a polarized emission of radiation such that each mesa portion M1, M2 and M3 emits radiation with a specific polarization. Since the mesa portions M1, M2 and M3 may be individually operated, radiation with different polarizations may be generated simultaneously and polarization multiplexing may be carried out to increase the link capacity.

Figure 21:
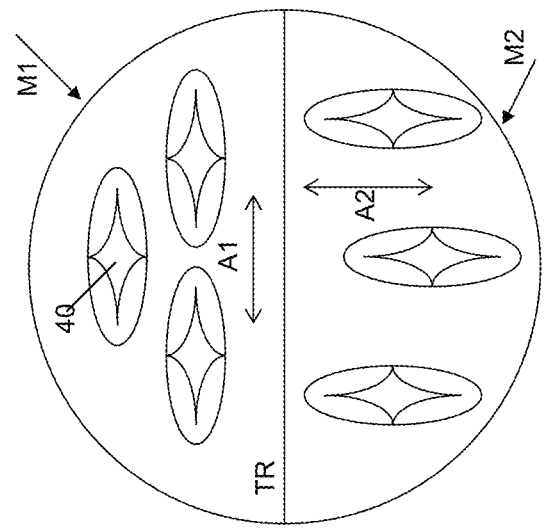
FIGS. 20-21 illustrate a third and fourth exemplary embodiment of a radiation emitter according to the present invention.

FIG. 21 depicts a fourth exemplary embodiment of a radiation emitter according to the invention. In contrast to embodiments according to FIG. 20, the mesa of FIG. 21 comprises two mesa portions M1 and M2 in which the apertures 40 are elongated along the same "portion-assigned" longitudinal direction A1 and A2. More specifically, each mesa portion M1 and M2 has its individually assigned orientation. The longitudinal directions A1 and A2 have an angle of 90° with respect to each other.

Since the elongated shape of the apertures 40 may lead to a polarized emission of radiation and since the mesa portions M1 and M2 may be individually operated, radiation with two different polarizations may be generated simultaneously and polarization multiplexing may be carried out in order to increase the link capacity.

FIGS. 22-25 show an exemplary method steps of fabricating apertures with different orientations.

Figure 22:
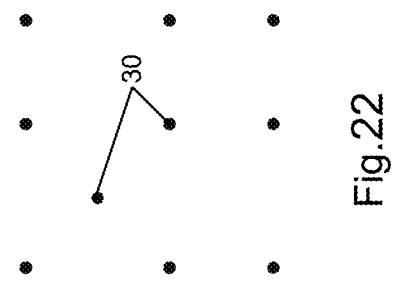

FIG. 22 shows a grid of holes 30. The distribution of the holes 30 leads to two apertures having similar shape but different orientation enabling the emission of polarized light as discussed above with respect to FIGS. 20 and 21.

The holes 30 can be etched by a chloric acid based dry etching process. Depending on the process parameters like temperature and gas flow, the oxidation speed can also depend on the crystal axes, becoming anisotropic thus also affecting the shape of the resulting apertures 40.

The distances between the holes 30 and the size of the holes 30 can be chosen to position a sufficient number of apertures 40 so close to each other that the light emission can be coupled into e.g. a 50 µm or 62.5 µm core of a multimode fiber MMF as discussed above with reference to FIGS. 16 and 17

Figure 23:
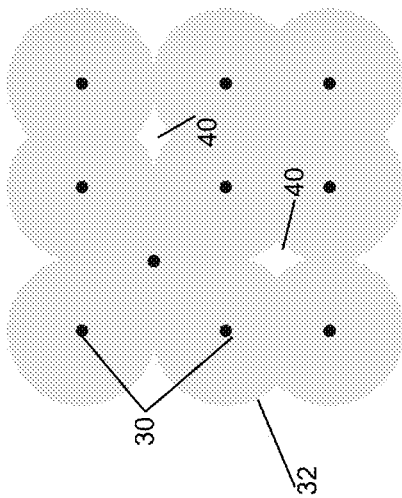
FIGS. 22-25 illustrate method steps for fabricating elongated apertures with orthogonal orientation.
Figure 25:
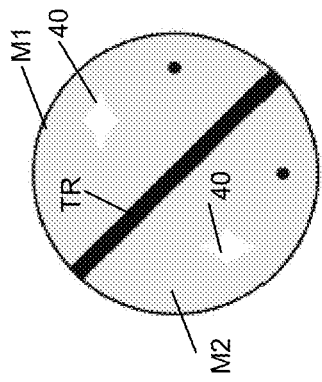

FIG. 23 shows the resulting apertures 40 based on an isotropic oxidation that yields circular oxidation fronts 32. The oxidation is stopped after two diamond-shaped apertures 40 with a 90° orientation difference have been formed.

Figure 24:
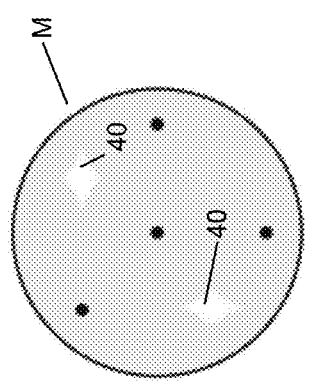

FIG. 24 shows the resulting structure after etching the mesa M.

Etching a trench TR at least down to the lowest oxidizable intermediate layer 21 underneath the active region 13 (see FIG. 2) separates the mesa M into several portions M1 and M2, which can be pumped independently to each other as discussed above.

In summary the exemplary embodiments described above relate to a method for fabricating a vertical-cavity surface-emitting laser (VCSEL) as radiation emitter 100 with multiple apertures 40 narrowly spaced in separate mesa portions M1, M2 and/or M3 of the same single mesa M. The mesa portions M1-M3 may be operated simultaneously, for instance by way of polarization multiplexing to increase the link capacity. Alternatively, the mesa portions M1-M3 may be operated alternatively, for instance to choose minimum EDR for varying bitrates.

The fabrication of the VCSEL 100 may be based on etching of narrow holes 30, e.g. 5 µm or less, in a regular array of a few µm distance between each hole into VCSEL wafers containing for instance AlGaAs (preferentially about 98% Al-contents) aperture layers. The arrangement of the holes 30 with respect to each other is variable and application dependent, for instance to generate specific shapes (e.g. elongated) and/or specific orientations of the resulting apertures.

The oxidation of the e.g. A10 apertures 40 is progressing from the inside of the holes 30. The orientation of the axes of the hole-arrays can be varied with respect to the crystal axes, thus leading to self-limiting orientation dependent oxidation processes. The novel VCSEL properties, including increased output power, defined EDR and polarization, enable data transmission across large fiber distances ~1 km at increased bit rates, reduced energy consumption and more.

The exemplary embodiments of the invention described above may have one or more of the following features and/or advantages:

Exemplary embodiments of the invention may relate to a method for fabricating a vertical-cavity surface-emitting laser (VCSEL) with multiple apertures narrowly spaced in a single mesa M that may result e.g. in single mode emission together with large optical output power and small electrical resistance.

Exemplary embodiments of the invention may consist of an active region sandwiched between two distributed Bragg reflectors (DBRs) and at least one oxide layer like a "normal" VCSEL structure. Any presently existing epi structure for high-speed oxide confined VCSELs can be used for the inventive approach. In contrast to presently employed VCSEL processing, the oxidation process may be based on etching holes of any shape into the wafer surface, exposing the oxide layer(s). These holes are serving as starting point for the lateral oxidation process.

The speed of the wet oxidation of the oxidizable layer(s) 21-24 may depend on Al-contents, AlGaAs layer thickness, and most importantly on the crystallographic direction. In addition, it is controlled e.g. by temperature, total pressure, and water partial pressure.

The arrangement of the etched holes in respect to each other and to the crystal axes, the distances between them, and finally the choice of the oxidation parameters impacts the shape of the resulting apertures and opens new design roads. The oxidation fronts may be circular or elliptical. The resulting apertures may have a diamond shape.

The final processing step may comprise mesa M etching, re-contact deposition, and planarization based on the processing steps developed for "normal" VCSELs.

GaAs/AlAs heterostructures are enabling the growth of lattice matched DBRs and high Al-content layers suitable for wet oxidation and leading to current and optical field confinement. The apertures will not be oxidized from the outside after etching a mesa M, but from the inside of holes, being first etched in regular arrays.

The arrangement of the blind holes with respect to each other and to the crystal axes presents a free design parameter. The resulting apertures however may have always the same size. A difference in distance of the holes in one direction and the other direction may lead to a difference in oxide diameter in both directions and may allow polarized emission if desired.

The oxidation speed depends on the crystal axes. The impact on the shape of the oxidation front has an impact on the shape of the resulting apertures.

The alignment between the series of holes defined by the mask and the crystal axes may enable a shape optimization of the oxide confined apertures and allows to control the polarization status of the emitted light.

The distances between the holes (d1 in one direction and d2 in the other direction) and the size of the holes can be chosen to position a sufficient number of apertures so close to each other, that additionally the emitted light emission can be coupled into e.g. the 50 or 62.5 µm core of a multimode fiber (MMF) preferably without coupling optics.

The optical power increases linearly with the number of apertures. If the size of the apertures is chosen in such a way that the laser emits single mode light, the intensity increases with the number of apertures, showing identical wavelength, polarization and transverse mode. The electrical resistance decreases similarly with the number of apertures. The total resistance $R_t$ can be calculated by $$\frac{1}{R_t} = \sum_{x=1}^{n} \frac{1}{R_x}$$

With the resistance $R_x$ of an individual aperture.

The various embodiments and aspects of embodiments of the invention disclosed herein are to be understood not only in the order and context specifically described in this specification, but to include any order and any combination thereof. Whenever the context requires, all words used in the singular number shall be deemed to include the plural and vice versa. Whenever the context requires, all options that are listed with the word "and" shall be deemed to include the word "or" and vice versa, and any combination thereof.

In the drawings and specification, there have been disclosed a plurality of embodiments of the present invention. The applicant would like to emphasize that each feature of each embodiment may be combined with or added to any other of the embodiments to modify the respective embodiment and create additional embodiments. These additional embodiments form a part of the present disclosure and, therefore, the applicant may file further patent claims regarding these additional embodiments at a later stage of the prosecution.

Further, the applicant would like to emphasize that each feature of each of the following dependent claims may be combined with any of the present independent claims as well as with any other (one ore more) of the present dependent claims (regardless of the present claim structure). Therefore, the applicant may direct further patent claims towards other claim combinations at a later stage of the prosecution.

The invention claimed is:

1. Method of fabricating a radiation emitter (100) comprising the steps of
   fabricating a layer stack (10) that comprises a first reflector (12), at least one intermediate layer (21-24), an active region (13), and a second reflector (14);
   locally oxidizing the at least one intermediate layer (21-24) and thereby forming at least one unoxidized aperture (40) in the at least one intermediate layer (21-24); and
   locally removing the layer stack (10), and thereby forming a mesa (M), wherein the mesa (M) comprises the first reflector (12), the at least one unoxidized aperture (40), the active region (13), and the second reflector (14);
   wherein before or after locally removing the layer stack (10) and forming the mesa (M) the following steps are carried out:
   forming at least a first unoxidized aperture (40) and at least a second unoxidized aperture (40) inside the intermediate layer (21-24) according to the following steps:
      vertically etching blind holes (30) inside the layer stack (10), wherein the blind holes (30) vertically extend at least to the intermediate layer (21-24) and expose the intermediate layer (21-24); and
      oxidizing sections of the intermediate layer (21-24) via the blind holes (30) and thereby forming said apertures (40) inside the intermediate layer (21-24);
   etching a continuous trench (TR) inside the layer stack (10), said trench (TR) separating and defining at least a first portion (M1) of the mesa (M) and at least a second portion (M2) of the mesa (M), wherein the trench (TR) severs the at least one intermediate layer (21-24) and separates the first and second unoxidized apertures (40) such that the first unoxidized aperture (40) is located in the first portion (M1) of the mesa (M) and the second unoxidized aperture (40) is located in the second portion (M1) of the mesa (M), wherein the continuous trench also separates the active region (13); and
   fabricating an individual electrical contact (61A, 61B) for each of the portions (M1, M2).

2. Method of claim 1 wherein said oxidizing of the intermediate layer (21-24) is carried out via the sidewalls (31) of the blind holes (30) in lateral direction, wherein from each hole (30) an oxidation front (32) radially moves outwards and wherein the oxidizing is terminated before the entire intermediate layer (21-24) is oxidized, thereby forming said apertures (40) that are each limited by at least three oxidation fronts.

3. Method according to any claim 1 wherein at least one of the first or second unoxidized apertures (40) has a rhombus-like shape where each side is formed by a circular or elliptical arc.

4. Method according to claim 1 wherein at least one of the first or second unoxidized apertures (40) has a triangle-like shape where each side is formed by a circular or elliptical arc.

5. Method according to claim 1 wherein the first unoxidized aperture (40) is elongated along a first direction (A1);
   wherein the second unoxidized aperture (40) is elongated along a second direction (A2); and
   wherein the first and second direction (A1, A2) are angled relative to each other.

6. Method according to claim 5 wherein a longitudinal axis of the first aperture (40) is oriented perpendicular to a longitudinal axis of the second aperture (40).

7. Method according to claim 5 wherein a longitudinal axis of the first aperture (40) has a 60 degree angle with respect to a longitudinal axis of the second aperture (40).

8. Method according to claim 1 wherein in each portion (M1) of the mesa (M) at least two apertures (40) are fabricated which have the same orientation.

9. Method according to claim 1 wherein there are a plurality of first unoxidized apertures (40) in the first portion (M1) of the mesa (M) that are oriented along a first direction (A1); and
   wherein there are a plurality of second unoxidized apertures (40) in the second portion (M2) of the mesa (M) that are oriented along a second direction (A2) which differs from the first direction (A1).

10. Method according to claim 1 wherein said trench (TR) defines a third portion (M3) of the mesa (M) in addition to said first and second portion (M1, M2), d
   wherein there are a plurality of first unoxidized apertures (40) in the first portion (M1) that are oriented along a first direction (A1);
   wherein there are a plurality of second unoxidized apertures (40) in the second portion (M2) that are oriented along a second direction (A2);
   wherein there are a plurality of third unoxidized apertures (40) in the third portion (M3) that are oriented along a third direction (A3); and
   wherein the first, second and third directions differ.

11. Method according to claim 1 wherein the first portion (M1) of the mesa (M) is provided with a first optical damping tuning layer (200) that is fabricated on top of the layer stack (10);

wherein the second portion (M1) of the mesa (M) is provided with a second optical damping tuning layer (210) that is fabricated on top of the layer stack (10); and wherein the characteristics of the first optical damping layer differs from the characteristics of the second optical damping layer.

12. Method of claim 11 wherein said oxidizing of the intermediate layer (21-24) is carried out via the sidewalls (31) of the blind holes (30) in lateral direction, wherein from each hole (30) an oxidation front (32) radially moves outwards and wherein the oxidizing is terminated before the entire intermediate layer (21-24) is oxidized, thereby forming said apertures (40) that are each limited by at least three oxidation fronts.

13. Method according to claim 1
wherein the layer stack (10) comprises two or more intermediate layers (21-24);
wherein at least one of the intermediate layers (21-24) is formed inside the first reflector or between the first reflector and the active region (13) and
wherein at least one of the intermediate layers (21-24) is formed inside the second reflector or between the second reflector and the active region (13).

14. Method of claim 1, wherein at least one intermediate layer is located below the active region.

15. Method of claim 1, wherein the trench is formed to separate at least one of a top contact of the layer stack so that the first portion of the mesa and the second portion of the mesa may be operated independently.

16. Method of fabricating a radiation emitter comprising the steps of
fabricating a layer stack that comprises a first reflector, at least one intermediate layer, an active region, and a second reflector;
locally oxidizing the at least one intermediate layer and thereby forming at least one unoxidized aperture in the at least one intermediate layer; and
locally removing the layer stack, and thereby forming a mesa, wherein the mesa comprises the first reflector, the at least one unoxidized aperture, the active region, and the second reflector;
wherein before or after locally removing the layer stack and forming the mesa the following steps are carried out:
forming at least a first unoxidized aperture and at least a second unoxidized aperture inside the intermediate layer;
etching a continuous trench inside the layer stack, said trench separating and defining at least a first portion of the mesa and at least a second portion of the mesa, wherein the trench severs the at least one intermediate layer and separates the first and second unoxidized apertures such that the first unoxidized aperture is located in the first portion of the mesa and the second unoxidized aperture is located in the second portion of the mesa, wherein the continuous trench also separates the active region;
wherein the first portion of the mesa is provided with a first optical damping tuning layer that is fabricated on top of the layer stack;
wherein the second portion of the mesa is provided with a second optical damping tuning layer that is fabricated on top of the layer stack; and
wherein the characteristics of the first optical damping layer differs from the characteristics of the second optical damping layer; and
fabricating an individual electrical contact for each of the portions.

17. The method of claim 16, wherein the trench is formed to separate at least one of a top contact of the layer stack so that the first portion of the mesa and the second portion of the mesa may be operated independently.

18. The method of claim 16, wherein at least one intermediate layer is located below the active region.

19. The method of claim 16, wherein in each portion of the mesa at least two apertures are fabricated which have the same orientation.

* * * * *